United States Patent [19]

Wegmann

[11] Patent Number: 4,983,269

[45] Date of Patent: Jan. 8, 1991

[54] METHOD FOR EROSION DETECTION OF A SPUTTERING TARGET AND TARGET ARRANGEMENT

[75] Inventor: Urs Wegmann, Balzers, Liechtenstein

[73] Assignee: Balzers Aktiengesellschaft, Balzers, Liechtenstein

[21] Appl. No.: 324,210

[22] Filed: Mar. 15, 1989

Related U.S. Application Data

[63] Continuation-in-part of Ser. No. 106,372, Oct. 7, 1987, abandoned.

[30] Foreign Application Priority Data

Dec. 23, 1986 [CH] Switzerland ............................ 207/86

[51] Int. Cl.$^5$ ............................................. C23C 14/34
[52] U.S. Cl. ........................... 204/192.13; 204/298.03
[58] Field of Search ........... 204/192.1, 192.12, 192.13, 204/298 MT, 298 ET, 298.03, 298.32

[56] References Cited

U.S. PATENT DOCUMENTS

| | | | |
|---|---|---|---|
| 4,140,078 | 2/1979 | Wilmanns | 204/298 MT |
| 4,166,783 | 9/1979 | Turner | 204/298 MT X |
| 4,311,725 | 1/1982 | Holland | 204/298 MT X |
| 4,324,631 | 4/1982 | Meckel et al. | 204/298 MT X |
| 4,336,119 | 6/1982 | Gillery | 204/298 MT X |
| 4,407,708 | 10/1983 | Landau | 204/298 MT X |

FOREIGN PATENT DOCUMENTS 3630737 11/1987 Fed. Rep. of Germany ...... 204/298 MT

*Primary Examiner*—Nam X. Nguyen
*Attorney, Agent, or Firm*—McGlew & Tuttle

[57] ABSTRACT

A device to detect erosion of a target surface of sputtering sources in cathode sputtering layouts which has a target with at least one sensor at a predetermined position which is unchanged during the cathode sputtering process, directly detects the eroding of the target at a predetermined location. As a sensor measured quantity, photometric, electrical temperature, or pressure in the process chamber is used.

17 Claims, 5 Drawing Sheets

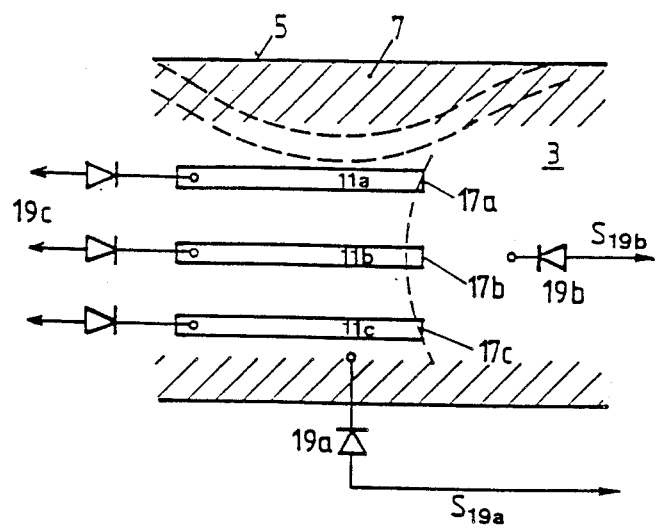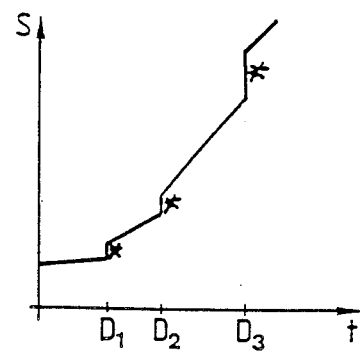
FIG. 4  FIG. 4A
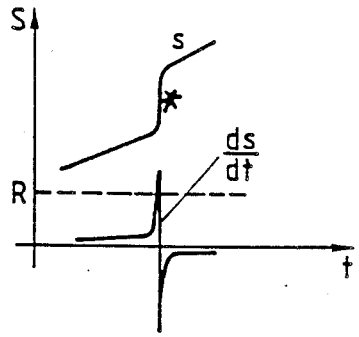
FIG. 5
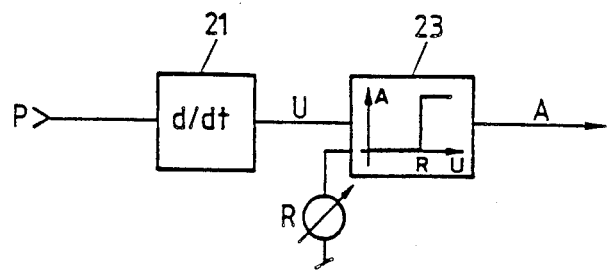
FIG. 6

METHOD FOR EROSION DETECTION OF A SPUTTERING TARGET AND TARGET ARRANGEMENT

This is a continuation-in-part application of application Ser. No. 106,372, filed Oct. 7, 1987, now abandoned.

FIELD OF THE INVENTION

This invention relates in general to a method and apparatus for the vapor deposition of coatings by sputtering and, in particular, to a new and useful method and apparatus for detecting a predetermined depth of erosion within a target of a sputtering source for cathode sputtering.

The invention particularly concerns an erosion-depth detection method for cathode sputtering targets as well as a target arrangement which provides for such detection.

The procedure of cathode sputtering is extremely widespread for the fabrication of thin coatings. The desired material is sputtered by ion bombardment of a suitable source. The ions required for this purpose are generated in a gas discharge by applying a negative voltage to the cathode and are then accelerated onto the cathode. The plasma density and consequently the rate of sputtering can be heightened by additional magnetic fields.

In the course of the sputtering, the cathode material erodes with continuing use. If a certain mass of material has been ablated, the sputtering process must be interrupted and the eroded cathode replaced by a new one.

The cathode materials must be very intensively cooled during the cathode sputtering process. There are two different methods for this. With direct cooling, the back side of the cathode is directly coated with coolant. By the indirect method, the cathode is clamped to make contact with a closed coolant channel. If we now suppose that such cathode is fully eroded through, in the one instance coolant would get into the process chamber, and in the other instance the structural material of the cooling channels would be ablated. In view of the high purity requirements imposed on the thin layers produced, such erode-through would result in not usable quality of the layer and thus bring about a shutdown of the entire unit. Contamination of the unit, furthermore, results in long down time for implementation of the necessary cleaning jobs.

It is, on the other hand, important to be able to consume the largest possible amount of target material before having to replace it, since on occasion very valuable materials like silver, gold, platinum or palladium are used as target material. Therefore, detection of at least one erosion depth on the target not only determines the operational safety, but also the lifetime of the target and in this way the economy of a cathode sputtering process.

It is further important, in management of sputtering process, not only to know when the target is about to be eroded through, but to exactly know when erosion reaches a predetermined depth of the target, so as to decide whether a new sputtering process shall be started with a partly eroded target or not in view of the risk to interrupt a current process if, during that process, the target is eroded through.

A familiar technique of getting information about erosion of a sputtering target comprises measuring the electrical energy consumed during the use of this target. Once a predetermined cumulative value of this energy is attained, the sputtering source is shut off. But since the rate of erosion of a target depends on various other parameters besides the expended energy, such as the properties of the material, pressure, type of gas employed, design features of the source and electric power density, this method achieves only an indirect and estimate determination of the ablation or of the still remaining thickness of the target. There must be provided a previous calibration of exactly that system in use. The accuracy and reliability of this method are low, e.g. due to random parameters influencing erosion. Moreover, in absence of reliable results, the process must be shut off rather too early with a sufficient margin of safety, which in turn leads to short working times of the system and poor exploitation of the target material.

Other prior art attempts have monitored a physical value during erosion of the target which changes as erosion proceeds through the target. A typical example of such a physical value is the temperature of the target, measured e.g. at its bottom side and which increases when erosion approaches said bottom.

If such a physical value is monitored during the erosion process and one tries from such monitoring to deduct an indication about the depth of erosion, one must, before such a method is applied, provide for a reference behaviour of that physical value in time during the erosion process, as a calibration curve, i.e. one must measure the eroded depth several times directly to install the relation between the curve of said physical value and actual depth of erosion. As the target material presents a homogeneous material phase, said physical value will smoothly and steadily change during erosion.

Such calibration curves must previously be registered for all different target materials. In view of the fact that not every target of same material will behave identically, there remains a high degree of uncertainty about such detection technique. Additionally, the erosion process is dependent of the target cooling. Thus, every change of cooling will render a reference curve registered before invalid for later measurements.

Temperature measuring techniques at the target material are disclosed in the U.S. Pat. Nos. 4,324,631 and 4,407,708. According to the U.S. Pat. No. 4,407,708 there is provided a temperature sensor at the bottom surface of a target. Therewith the temperature is measured which changes when erosion proceeds. In dependency of this progression of erosion there is attained a temperature towards target thickness curve which is smooth, in spite of the fact that it shows a progressively raising slope when the erosion approaches the bottom surface, adjacent to which the temperature sensor is mounted.

Occurrence of a rising slope of said curve is taken as criterium that the target is about to be eroded through. An exact accurate detection which thickness remains of the target material is not possible.

Here again, the disadvantage of this method is the fact that the behaviour of the temperature versus thickness curve must first be empirically ascertained as a reference in a calibration curve and during a calibrating experiment, since such curve is not only dependent on the extent of erosion, but also on the material of the cathode, its structural configuration and cooling. Thus again, no accurate detection of a remaining target thickness is achieved with this method.

Finally, prior art has proposed to get information about the erosion of the target by measuring the sputtering voltage (Swiss Pat. No. 657 382), in the case of ferromagnetic targets, by measuring the magnetic induction below the target using Hall probes. (British Pat. No. 2 144 772, claim 8), by measuring the induction of a magnetic stray field (German Pat. No. 34 25 659, p. 73), or, in the case of nonmagnetic target materials, by measuring the plasma impedance or plasma voltage in the process chamber (German Pat. No. 34 25 659, p. 75 ff.). All these methods, however, represent again an indirect measurement of the depth of the target erosion, and therefore require additional, sometimes very elaborate empirical investigations to calibrate the particular system and to provide for an accurate reference. They are handicapped by relatively large uncertainty factors, which cannot be tolerated in industrial practice, especially in operation of production plants with high degree of automation.

SUMMARY OF THE INVENTION

The present invention provides for an accurate direct determination of the erosion depth of the sputtering target during a cathode sputtering process, and thus for a substantial improvement in operating safety and economy of such sputtering sources.

The problem is solved by the inventive method for detecting a predetermined depth of erosion within a target of a sputtering source for cathode sputtering which comprises the steps of:

providing at least one material discontinuity at a predetermined depth along the path of erosion-progression through the target, so that when said erosion passes said discontinuity, a physical value significantly changes, monitoring said physical value, detecting from said monitored physical value a predetermined change as said significant change and as an indication that said erosion has reached said discontinuity at said predetermined depth.

The invention is thus based on the recognition that, if there is installed along the path of erosion through the target material a material discontinuity at a predetermined depth which discontinuity provides for a significant, as for an abrupt change of a physical value, as soon as erosion passes said discontinuity, and one monitors said physical value, detection of a predetermined change of said monitored physical value, as said significant change provides for a clear and accurate indication that erosion has just reached the depth where said discontinuity has been installed.

If one considers progression of erosion, which finally will reach the material discontinuity, it becomes clear that after that moment and due to said discontinuity, a material will be exposed to sputtering, which is different from the target material which was exposed at the beginning of the sputtering process. As soon as this second material is exposed to the sputtering process, this could lead to a change, possibly to contamination of such a process and then to spoiling of the substrate to be coated.

Therefore, it is further proposed that the above mentioned discontinuity be provided by a material interface of target material and a material which is compatible with the sputtering process to prevent for contamination of sputtering after erosion has reached the discontinuity.

In a most simple manner said compatible material which forms one side of the interface to generate the significant change of the physical value being monitored, is a gas. Thereby the expression gas should principally be understood as gas at any pressure reacting from vacuum to atmospheric or even above atmospheric. If, e.g., along the path of the erosion there are provided within the target material one or several compartments filled with a gas, e.g. communicating with the vacuum chamber of the sputtering machine, so as to have the same atmosphere as is used for the sputtering process, and heat development is measured at the bottom side of the target, each time the erosion enters such a compartment or penetrates the according target material/gas interface, the eroding arc will step-like approach the detection area by the extent of the compartment. Thus, each time such a compartment is penetrated, there is detected a significant variation of heat, indicating that erosion has reached the predetermined depth along the erosion path through the target material. By such discontinuities a scaling of depth is in fact installed along the erosion path.

Especially if discontinuities are provided along the erosion path, remote from an area where respective sensor means are arranged and where the sensor means are separated from said discontinuity by a rigid material and not by a gas, it is a most practicable approach to monitor, as said physical value, heat developed at the sensing area and to detect from said heat monitored a predetermined change as indication that the erosion has reached the discontinuity at the predetermined area or depth along the erosion path through the target.

Thereby one must consider that heat flow through the rigid material from the material discontinuity to the area where the sensor is arranged, follows the laws of heat diffusion. Therefore, the sensor will not detect reaching of the discontinuity instantaneously, but with a certain time lag due to diffusion through the remaining material between the discontinuity and the sensor. Thus dimension and heat flow characteristics of the material should clearly be defined or should be selected to provide for a shortest possible time-lag as by selecting a relatively thin layer of material with good thermal conductivity.

The problems (a) of not contaminating the sputtering process by a sputtered material different from the target material and (b) of shortest possible time-lag between reaching the material discontinuity by the erosion and sensing the significant temperature change at the sensor are preferably both resolved by providing the discontinuity by a material interface of target material and a gas and by placing a sensor means for monitoring and detecting within said gas. As physical value in a gas compartment there may be monitored a gas pressure, which significantly changes when the compartment, containing gas, is opened by the erosion or light which significantly changes when said erosion penetrates the compartment or the appearance of charged particles as ions or electrons within the compartment, due to the penetration, or even occurrence of a sudden bombardment by particles entering the compartment.

For some kinds of physical value inventively monitored, as for light, the significant change will in most cases depart from zero level as it will be dark in a compartment until it is opened by the erosion. Then light will penetrate the compartment.

For other kinds of physical value inventively monitored, as for temperature, heat radiation, gas pressure, said physical value will change more or less steadily and mostly unpredictable to a certain extent during the erosion process of the target material towards the discontinuity. Therefore the significant change of such a physical value when the erosion reaches the discontinuity may occur at an absolute level thereof, which is uncertain. Knowledge of such an absolute value would here necessitate a calibrating procedure according to the prior art methods, which just should be omitted according to the object of the present invention. If e.g. there is provided a compartment and there is monitored within said compartment a gas pressure as said physical value, heat developed within the compartment during the erosion process towards said compartment will lead to a rise of the pressure in the compartment. Thus the absolute level of pressure at which the erosion penetrates the compartment, would have to be ascertained by a calibrating procedure, if the inventive method would depend on that absolute value.

Therefore inventively there is detected a significant change of said value as a difference value, such a change being independent of the value-level at which it occurs. One preferred technique to get independent from absolute level is to detect the significant change by comparing a time derivation or, as an approximation therefrom, a value difference per time with a pre-selected reference value.

As the evaluation of the physical value is thus based on a difference evaluation, the level, at which this difference occurs, becomes in fact, similarly to a common mode signal, unsignificant.

As became apparent from the above, in connection with the present invention, the expression "material" is used for any kind of phase which may include, as was noted above, rigid material, possibly liquid material, and preferably a gas, at any pressure.

To perform the inventive method described above, there is provided by the present invention a target arrangement for a sputtering source for cathode sputtering, comprising:

a target of a selected target material, defining a target surface for exposing to sputtering, beyond said surface, a material interface, at which said target material rests or is contacted by a further material, sensor means arranged at least in vicinity of said interface, said sensor means sensing a physical value, which significantly changes as sputtering erosion reaches said material interface.

The present inventive method and arrangement accordingly provide for a direct and reliable determination of the depth of erosion in the sputtering target during the cathode sputtering process and thus a substantial improvement in operation safety and economy of the sputtering sources.

The inventive method and arrangement do not need a preliminary calibration. The erosion depth at which the significant change of the physical value monitored will occur, can be freely chosen by appropriately placing inventively the discontinuity along the path of erosion. Thus, the inventive method constitutes a direct measurement of the ablation of the target surface, unlike methods of prior art, where a physical value is monitored during erosion of the target and compared with a calibrating course to determine when erosion is about to reach a predetermined depth: In fact, the magnitude and course of the physical value monitored does not interest during erosion up to a depth where the material discontinuity is installed.

As physical values according to the present invention basically all such values are suitable which display a significant change, when the cathode sputtering process or the erosion reaches the material discontinuity. Such physical values may be photometric quantities (luminous intensity, luminous density, luminous flux, etc.), number and density of electric charged particles, temperature, pressure, and so on. Other physical values could also be monitored in special applications, such as partial pressure of certain components in the process chamber, the wavelength of emitted light, and so on. The implementation of the inventive method and arrangement are especially simple and effective when physical values of the plasma discharge itself are used for the evaluation.

The invention may be applied in DC, HF or microwave sputtering techniques.

It is further especially advantageous to provide inventively said discontinuity along a path of erosion where presumably the heaviest erosion will occur during the cathode sputtering process. Furthermore, in the case of sputtering sources where not only the final state, but also intermediate states of target erosion are to be detected, or where erosion-depth distribution along the target surface should be monitored, it is advantageous to install a number of such discontinuities staggered in depth through the target material to detect respective depths of erosion and/or to provide such discontinuities along and beyond the target surface at equal or at different predetermined distances from the virgin surface.

When providing two or more such discontinuities, the resulting significant changes of the physical value may be monitored either by one sensor means or by a respective number of sensor means attributed to respective discontinuities and closely coupled thereto.

In all configurations of the invention where a compartment or a recess is provided to form at least one material interface or material discontinuity, the sensors can be secured in such recess or compartment inside the target. Another possibility is to provide the sensor means in respective recesses of a cooling plate located behind the target.

It is recommended not to place the sensor means in such an area of a compartment, which first will be penetrated by erosion, but remote from such areas, on one hand to ensure that the sensor itself will not be damaged by the sputtering process entering such compartment, and on the other hand not to contaminate the process atmosphere by surface material of the sensor.

Deterioration of the sensor may occur in such compartments or recesses penetrated by erosion by partially coating the sensor by back sputtering of material. This would require an additional cleaning of the sensor and in more severe cases the signal provided by such a sensor would afterwards be distorted.

If there is provided a compartment or recess to provide for at least one material discontinuity and sensor means are just placed in an area of such a compartment or recess, where erosion first penetrates, there is a further drawback in that the surface material of the sensor itself is ablated for a brief time. This may result in contamination of the thin layers, produced in the process chamber, which in view of possible high purity requirements may lead to enormous economic sacrifices.

Thus, in such cases where such compartments or recesses are provided to provide for the discontinuity, either, and as said above, the sensor means are placed remote from that area where erosion will first penetrate such compartment or recess, or the sensor means are separated from such compartment or recess by target material, which may be realized by having the surface of the sensor means made of such target material or by placing the sensor means beyond such compartments or recesses and separated therefrom by a layer of target material.

For the individual configurations of the present invention, there are a multitude of designs available. For example, the sensors can be fastened in blind holes, whose axes correspond to that of the erosion process of the target. Through the erosion process, these blind holes are also opened on the side of the process chamber. The sensors can also be placed in continuous bore holes or grooves, the axes of which are more or less perpendicular to that of the erosion process of the target. This alternative appears especially advantageous in the case of sputtering sources with direct cooling, where placing the sensor in a flow of coolant would involve structural hindrances.

In this configuration, the sensors can also be designed as signal generator and signal receiver, and the disturbance of a constant signal by exposure of the bore hole or groove in the course of the erosion process for its part constitutes a direct measure of the depth of erosion. With this strategy, changes in a luminous flux, in the electrical conductance, or in the pressure in the bore hole can be used to determine the predetermined depth of erosion.

Besides photometric values (luminous intensity, brightness, light current, specific radiation of light, quantity of light, density of light, exposure, etc.), as was mentioned above, the inventive method and arrangement may use as physical value electrostatic or electric quantities (number of density of electric charge carriers, electrical conductivity, etc.), heat measured by temperature measurement and a pressure in the process chamber. An additional configuration of the invention involves detecting the partial pressure of individual components in the process chamber by making use of chemical detection methods, as well as selective processing of the resulting signals by means of characteristic frequencies of the discharge during the cathode sputtering process or by means of the characteristic wavelength of light in the case of using photometric quantities. In the first instance, this means that the signals picked up at the sensor means are processed in such a way that only the characteristic frequencies of the discharge during the cathode sputtering process are evaluated, while other frequencies are cut off. In the second instance, the selective processing by means of wavelength requires that the processing system be supplemented with a monochromator.

To relay the signals in the case of photometric quantities, familiar light guide fibers are suitable, which moreover offer the structural advantage that the sensor mounting, in fact the end of such a light guide fiber, need not be made from an insulator.

The signal processing can be so organized that the abrupt change in the monitored physical value upon eroding up to the discontinuity results in immediate shut off of the sputtering source. In certain cases, it may be better advised to select the depth of such a discontinuity in the target such that, after erosion has penetrated up to this discontinuity, sufficient target material remains to allow the initiated process step to run its course. For this purpose, a time interval should be programmed in advance between the abrupt change in the magnitude of the physical value monitored and shut off of the sputtering source, corresponding to the time required for completion of the process step. It is clear that in such cases there must remain beyond said discontinuity enough target material to complete the process step without the target being completely eroded through. This assures that a process, once begun, will not have to be aborted, which is an undesirable eventuality, resulting in impairment of the quality of the layers produced or even defective products, as well as wasteful production interruptions.

The various features of the invention are pointed out particularly in the appendent claims, forming a part of this disclosure. For a better understanding of the invention, its operating advantages and specific objects attained by the invention, reference is made to the accompanying drawings and descriptive matter in which preferred embodiments of the invention are illustrated.

GENERAL DESCRIPTION OF PREFERRED EMBODIMENTS

Figure 1A:
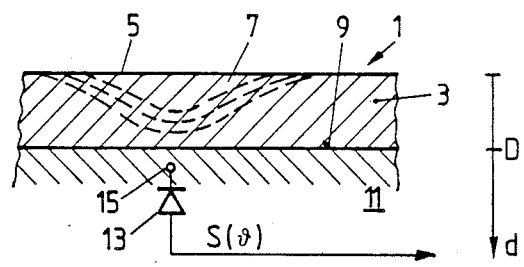
FIG. 1a schematically an inventive target arrangement for detecting the depth of erosion following the general principle of the present invention, FIG. 1b qualitatively on the time axis the course e of erosion and of an output signal s of a sensor, arranged according to FIG. 1a, FIG. 2 schematically a further realization form of an inventive target arrangement, FIG. 3a again schematically a still further inventive target arrangement, FIG. 3b on time axis, the output signal of sensor means, arranged according to FIG. 3a, FIG. 4 again schematically a further form of an inventive target arrangement with the resulting qualitative time course of an output signal of sensor means, FIG. 5 on time axis qualitatively the output signal of an inventively provided sensor means and of its inventively exploited time derivation, FIG. 6 in block diagrammatic form an evaluation unit, to which sensor means are connected.

According to FIG. 1a, a target 1 comprises a predominant part of target material 3, defining a surface 5, exposed to the sputtering process. As the sputtering process per se is well-known in the art and not part of the present invention, it is not further described here. By the sputtering process, the virgin surface 5 of the target material 3 is more and more eroded, as indicated quantitatively in dash-lines at 7.

At a predetermined position along the path of this erosion 7 there is inventively provided a material discontinuity, according to FIG. 1a realized by a material interface 9, along which the target material 3 contacts a further material 11.

In vicinity and beyond the interface 9, there is provided a sensor 13 in the embodiment shown in FIG. 1a, preferably a temperature or heat detector. The heat detector 13 outputs an output signal $S(\theta)$ as a function of the temperature $\theta$ sensed at the sensing area 15 beyond and in vicinity of the interface 9.

The entire depth of target material 3 up to the interface 9 is referred to, according to FIG. 1a, by D, whereas the axis, along which erosion 7 propagates through the target material 3, is denoted with a coordinate d.

Figure 1B:
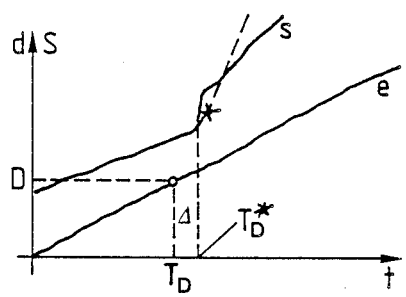

According to FIG. 1b, when the sputtering process is started, the erosion 7 according to FIG. 1a starts at the virgin surface 5, i.e. at the value d=0, and follows during sputtering process-time t a course e, which course in FIG. 1b is purely qualitative. When erosion according to course e reaches the depth D, the erosion penetrates the interface 9 to the second material 11 and propagates therein. As the sensor means in this example is taken to be a temperature detector 13, the material 11 is selected to provide for thermal conductivity which is preferably significantly different from the thermal conductivity of target material 3, e.g. higher. Thus, the output signal S of the detector 13 will show a significant change in course, as e.g. a step-like jump due to erosion penetrating the interface 9, or (dashed lines) a significant change in slope ds/dt.

According to FIG. 1b there will thus occur, shifted by a time-lag $\Delta$, a significant change in the course of the output signal S of detector 13, which signal being again only qualitatively shown. The time-lag $\Delta$ results from temperature or heat diffusion from the interface 9 to the sensing surface 15 of the detector 13. By selecting the distance between the sensing surface 15 and the interface 9 and characteristic parameters of heat propagation of material 11 accordingly, the time-lag $\Delta$ between penetration of the interface 9 by the erosion 7 and occurrence of the significant change in the course of output signal S is minimized or at least predetermined, e.g. of such shortness that it is irrelevant with respect to process erosion speed:

As the erosion process is rather a slow propagating process, it is not a problem to minimize the time-lag $\Delta$ to such an amount that it becomes neglectible with respect to propagation of the erosion 7.

From FIG. 1a and FIG. 1b the general principle of the present invention becomes clear. As there is only detected the occurrence of a significant change * of the output signal S of a sensor means, as of heat detector 13, which significant change * is physically caused at the interface 9, and as that discontinuity or interface 9 is disposed at a predetermined, exact depth beyond the virgin surface 5 of the target, there is realized a casual, direct link between the erosion reaching interface 9 and the occurrence of the significant signal change *.

By considering FIG. 1 it might be seen that once the erosion 7 penetrates interface 9, there will be locally a material 11 exposed to the sputtering process which is different from the target material 3. In spite of the fact that the material 11 might be such that it does significantly contaminate the sputtering process or even to provide for a desired second sputtering phase, in many cases it is not desired to influence the sputtering process during its course by suddenly sputtering a material different from the original target material 3.

Figure 2:
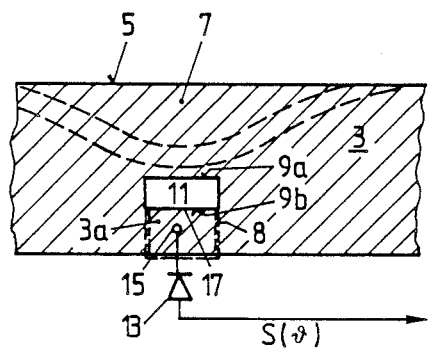

This problem is resolved by the technique as shown in FIG. 2. Here there is provided within the target material 3 a compartment 17 across the erosion path of erosion 7. E.g. a heat detector 13 is again placed beyond the compartment 17. The volume or material enclosed or entrapped within compartment 17 forms the second interface material 11 and there is realized by such a compartment 17 along the erosion path in direction of a first interface 9a at the top surface of compartment 17 and a second interface 9b at the bottom thereof. There might be entrapped in the compartment 17 the same atmosphere at which the sputtering process in the chamber operates. The fact that the sensing surface 15 of the detector 13 is separated from the compartment 17 makes sure that once the erosion 7 penetrates said compartment, there remains still a target material bridge 3a of predetermined thickness between the instantaneous erosion and the sensing surface 15, so that spoiling of the sputtering atmosphere will not occur. Normally the target 1 is cooled. As shown in FIG. 2 at 8, a heat or temperature sensing surface 15 of the sensor 13 may be thermally isolated from the surrounding material 3 to be widely independent from cooling.

The step-like advance of the erosion 7 through the compartment 17 will again be deleted with respect to detector 13, according to the thermal conductivity characteristics of the target material bridge 3a, by a predetermined time-lag $\Delta$.

According to FIG. 3a there is provided within a compartment, as was described with reference to FIG. 2, a sensor 19. By such a sensor 19 there might be detected a pressure, the occurrence of charged particles as of ions or electrons in the compartment 17 or of other physical values which significantly change when the erosion 7 penetrates the upper interface 9a formed between the volume with respective material 11 entrapped in compartment 17 and the target material 3. Thus, the compartment 17 might be subjected to a pressure, which is different from the working pressure in the sputtering chamber, so that, when the erosion 7 penetrates interface 9a, the detector 19, then a pressure detector, will detect a sudden change of pressure as is qualitatively shown in FIG. 3b. By arranging the sensor 19 remote from a region within compartment 17, where erosion will first penetrate, the sensor is again protected against influence of the sputtering process. Physical values may be selected to be sensed by a respective sensor, which have no time-lags in propagation through the atmosphere 11 in compartment 17. Then no time-lag will occur between penetration of erosion 7 into the compartment 17 and the significant change * of the output signal of detector 19.

According to FIG. 4 there is provided beyond the virgin surface 5 of the target made of target material 3, staggered at predetermined depths, more than one, e.g.

three, compartments 17a, 17b and 17c. This is provided if one would like to get information about reaching different depths by the erosion 7. If there is provided a single thermal detector 19a, again different time-lags will have to be considered between penetration of erosion 7 into first compartment 17a up to occurrence of significant change in the output signal of detector 19a and, accordingly, between penetration of the erosion 7 into the other compartments 17 and respective occurrence of significant changes in said output signal $S_{19a}$. When a thermal detector 19b is arranged substantially equidistant from the channels 11a, 11b and 11c, there will be again a time-lag according to $\Delta$ of FIG. 1b to be considered between penetration of respective compartments 17 by the erosion 7 and occurrence of a significant change in the output signal $S_{19b}$ of detector 19b. In opposition to the arrangement with detector 19a, where three different time-lags must be considered, the arrangement of detector 19b will provide for a single time-lag for all compartments 17. With provision of a detector arrangement 19c, which comprise charged particle-, light- or pressure-detectors within respective compartments 17, there will appear practically instantaneously the significant change * in the output signal of the detectors when the erosion 7 penetrates the compartments.

Again, lateral shifting of the sensing surfaces of the detectors of arrangement 19c ensures that they are not damaged when the erosion 7 penetrates the channels. At the right hand side there is quantitatively shown the output of detectors or of one detector at the arrangement just described, in that, without considering respective time-lags, at each penetration of erosion into a compartment there will be a significant change in output signal or signals S as indicated by *.

As was described with respect to all schematically shown embodiments, only a significant change in the output signal of a detector or of a physical value detected by such a sensor when erosion penetrates a material discontinuity is detected, thus the absolute signal level, at which such a significant change occurs, is not important. This is very advantageous in that no calibration must be provided.

According to FIG. 5 the output signal S of any kind of detector used is preferably differentiated to result in a time derivate signal ds/dt which latter signal is compared with a reference value signal R so that, as soon as said time derivate surpasses or reaches the reference value R, the occurrence of the said significant change in output signal S is recognized and a control signal may be produced to further control the sputtering process. This may be done to stop it at once or to continue it up to the end of the instantaneous process and just giving an indication that no further process should be started with the target presently in use. If there is used a physical value with a clearly defined absolute level at all moments before erosion reaches the discontinuity, as light in a compartment, no differentiation could be necessary.

According to FIG. 6, in general terms, the physical value P monitored is differentiated in a differentiating unit 21 to form a time derivate signal U, said time derivate signal U being led to a comparator unit 23, at which signal U is compared with a preferably adjustable reference signal R. The output signal A of the comparator unit 23 is significant for the occurrence of the significant change in signal shape S and thus significant with respect to the fact that erosion has reached the inventively provided discontinuity or has reached it since a predetermined time-lag $\Delta$. The differentiating unit 21 might be directly a sensor or detector, e.g. a pyro-electric detector which directly detects changes of heat radiation versus time or might be realized by a differentiating unit, to which a sensor or detector arrangement is connected at its input and which latter measures the instantaneous level of the physical value.

Based on the principles of the present invention, which were described with the help of FIGS. 1 to 6, there now will be described further and preferred embodiments of the inventive arrangement, working according to the inventive method.

In particular, the invention embodied therein comprises an apparatus for the vapor deposition of coatings by sputtering which comprises the housing or vacuum chamber forming member 78 capable of being evacuated and having a cathode 711 therein which is mounted in the chamber. Insulation means in the form of an insulated ring member 79 is disposed between the housing 78 and the cathode 711. The target mounting frame 72 is mounted on cathode 711. In accordance with the invention, a target of material to be sputtered is designated 71 and is mounted on the cathode 711. The surface of the target 71 is subject to erosion 712 by the sputtering process. An anode 77 is mounted in the housing in spaced relationship to the target 71 and the cathode 711. In accordance with a feature of the invention, at least one sensor 714 is provided in the housing adjacent to the target 71 and positioned to detect a predetermined depth of erosion of the target. The output of sensor 714 is connected to a differentiating amplifier 718, the output of which being galvanically separated from its input, then via a comparator 719 preferably with preselectable hysteresis and with an adjustable reference signal source 719a to switch means including a switch member 720 for responding to the significant change of the output of the sensor 714 and, for example, for closing off an electrical control current so as to stop sputtering.

The evaluation unit of sensor 714 and amplifier 718 is, generally provided such that it evaluates in analogue or digital technique the output signal of sensor 714 on the occurrence of a predetermined change, thus forms a difference of subsequent samples of the output signal of sensor 714 at predetermined time intervals in digital technique, or provides, in analogue technique, the time derivation d/dt of said output signal. If the sensor 714 monitors a physical value, the level of which being accurately defined before the erosion 712 penetrates the discontinuity between the compartment wherein the sensor 714 resides and the target, as light, charged particles etc., a differentiating unit 718 may be omitted.

Figure 7:
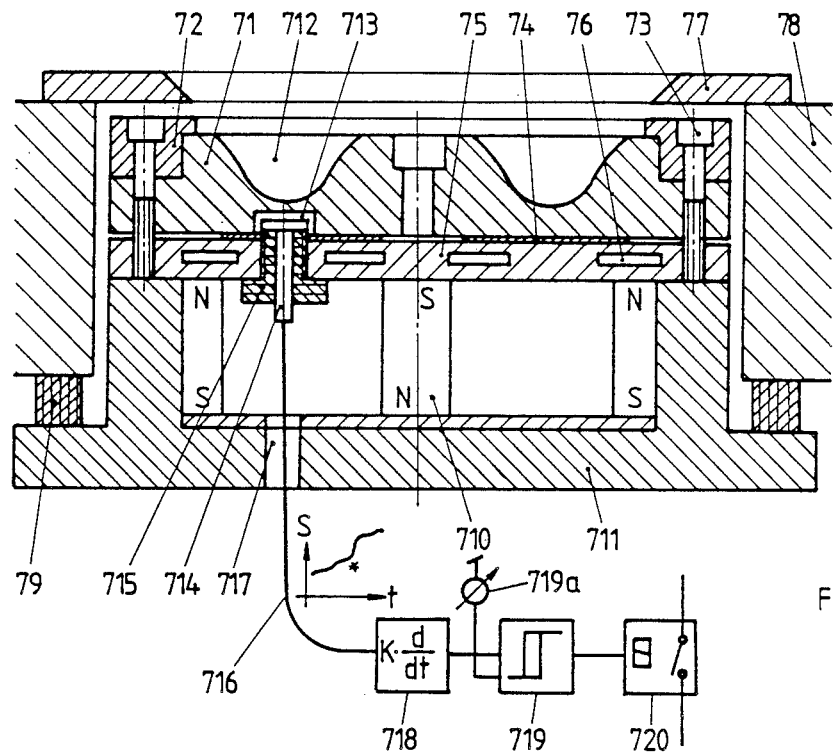
FIG. 7 is a cross-sectional view through a sputtering source with indirect cooling constructed in accordance with the invention.

The sputtering source shown in FIG. 7 is constructed from a platelike target 71, which is eroded during the course of the cathode sputtering process and whose material is used to produce a thin layer on a substrate. This target 71 has a shoulder at its margin and is connected by a target mounting frame 72, inserted in this shoulder and facing the process chamber, to a cooling plate 75 by means of screw fastenings 73. The thermal contact between the target 71 and the cooling plate 75 can be improved by an intercalated foil 74 of smooth material with good thermal conductivity. The cooling plate 75 has a number of channels 76, through which coolant is conveyed. The assembly of target 71 and cooling plate 75 is secured to the cathode 711, inside which there is a magnetic system of permanent and/or of electro-magnets 710. The cathode 711 is secured by means of insulators 79 to a flange of the process chamber 78, on the side of which, facing the process chamber, there is mounted a dark space screen 77, as the anode.

To detect that erosion 712 of the target 71 has reached a predetermined depth, the target has a compartment or recess 713 on its side away from the process chamber, which is lined up with a corresponding boring in the cooling plate 75. Screwed into this boring of the cooling plate 75 is a mounting 715 for the sensor 714, whose flat end projects into the recess 713 in the target 71. Depending on the type of measured physical value to be detected by the sensor, the sensor mounting 715 is made either of an insulating or an electrically conducting material.

When the margin of the recess 713 forming a material discontinuity with respect to the material of target 71, is eroded through in the course of the cathode sputtering process, the physical value used as the measured quantity (photometric quantities, electric charge, temperature, pressure, etc.) changes abruptly in recess 713 due to direct contact of recess 713 and process chamber. This significant change is registered by the sensor 714 which generates, on output line 716 through boring 717 in the cathode, to the evaluating system 718, 719, 720 a respective output signal S. Preferably, the sputtering source is switched off only after a predetermined timelag with respect to detection of the significant change *, which guarantees optimal utilization of the target 71 without risk of a complete burning through of the target by erosion at a more extended area. This extends the service life too.

Figure 8:
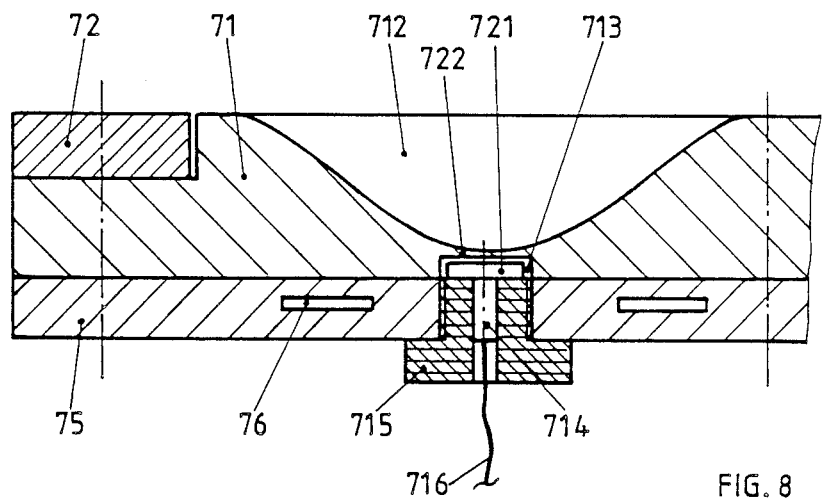
FIG. 8 is an enlarged detail view of the device of FIG. 7.

FIG. 8 shows an enlarged detail from FIG. 7. The sensor mounting 715 is recognizable as a peglike structure, having a threading to screw into a corresponding bore of the cooling plate 75. The sensor 714 terminates in a sensing platelet 721, which projects into the recess 713 of the target 71 and may serve as an electrode, for example, to detect the electric charges in the recess 713 in case of breakthrough. It is convenient to have this platelet made of the same material as the particular material of the target 71. Since after the breakthrough the material of this platelet is necessarily ablated for a short period of time, this prevents the layers already produced from being contaminated by sputtering different material from platelet 721. The inventively provided discontinuity is formed at 722, the interface of target material and gas, filling the recess 713.

Figure 9:
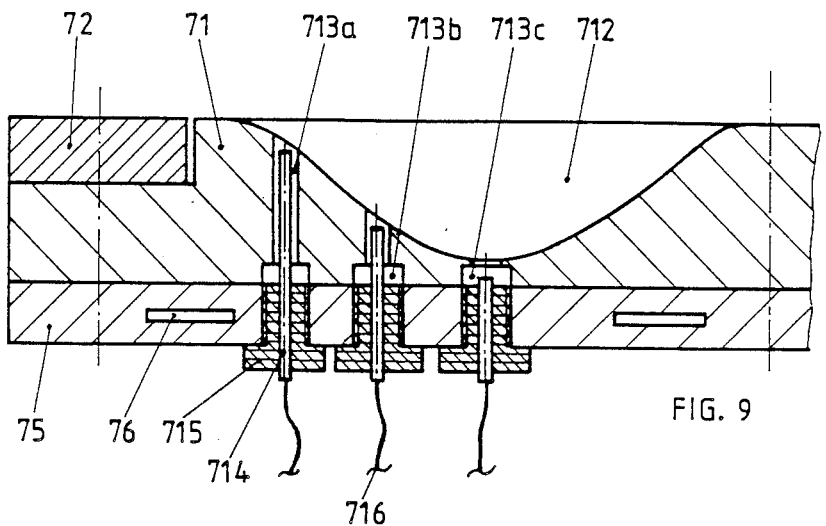
FIG. 9 is a cross section, similar to FIG. 8, of another embodiment of a sputtering source with a number of sensors and indirect cooling as per the invention.

FIG. 9 shows another target with indirect cooling. It has a number of recesses 713a, 713b and 713c, which project into the target from its back side by various amounts. Such arrangement makes it possible to detect reaching of progressively rising depths by the erosion 712 of the target 71 and to plan the shutting off of the sputtering source long in advance. To prevent damage of respective sensors 714, it is possible to retract the sensors 714 from the recesses 713, once such a recess has been reached by the erosion 712.

Figure 3A:
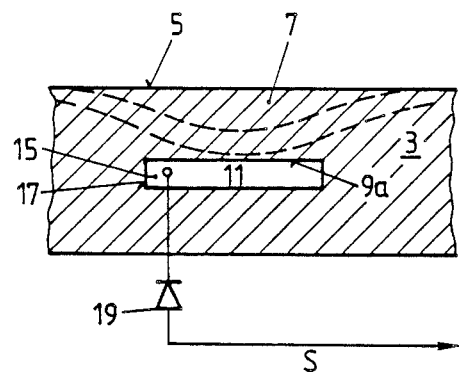
Figure 3B:
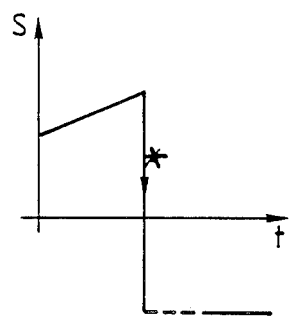
Figure 10:
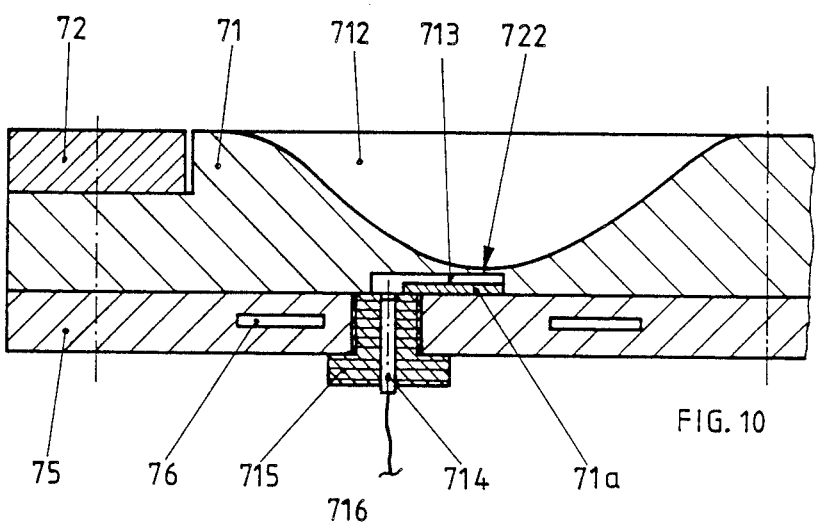
FIG. 10 is another cross section of another embodiment of a sputtering source, where the site of presumptive erode-through is not identical with the position of the sensor.

The configuration of the invention shown in FIG. 10 has the peculiarity according to principle of FIG. 3a that the location of anticipated reaching of discontinuity 722 by erosion 712 does not coincide with the position of the sensor 714. Instead, these two locations are only coupled by the extent of recess 713. Moreover, the sensor 714 is somewhat sunk into the bore of the cooling plate 75 and therefore is not in mechanical contact with the target 71. This configuration of the invention, especially suited for optical sensors to monitor optical values, not only hinders ablation of the material of the sensor after erosion has reached the discontinuity or interface 722, but also makes sure that the sensor 714 itself is not coated, which would falsify the measurement results and necessitate a costly cleaning of the sensor. To avoid contamination of the sputtering process, a cover platelet 71a made of the target material can be provided.

Figure 11:
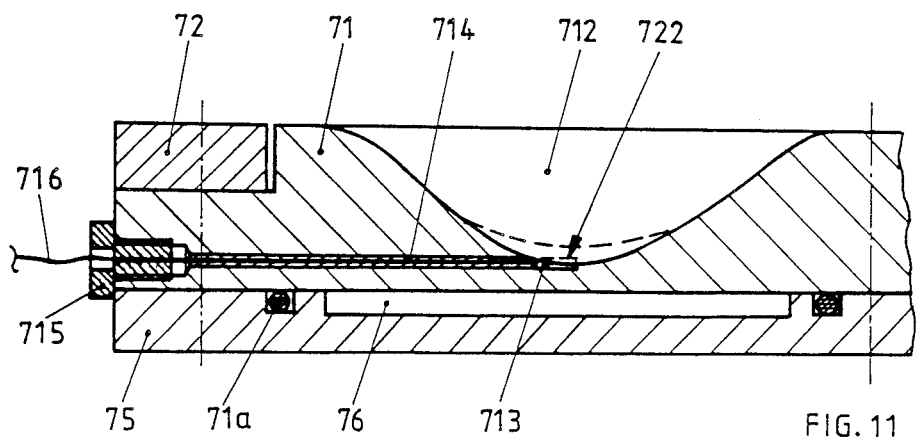
FIG. 11 is a cross section through another embodiment of a sputtering source with direct cooling as per the invention.

The configuration of the invention shown in FIG. 11 displays direct cooling in which the coolant channel 76 abuts directly on the target 71 and a seal 71a is provided between this and the cooling plate 75. In this configuration, the sensor 714 is installed in recess 713 on the side of the target 71. This recess 713 is configured as a blind hole, the depth of which depending on the location where the erosion 712 of the target 71 is to be ascertained. If the sensor 714 consists of a lightguide fiber, as depicted in the figure, no difficulties will be caused by the rather large depth of the blind hole 713. In this case the sensor mounting 715 need not be made of an insulating material.

Figure 12:
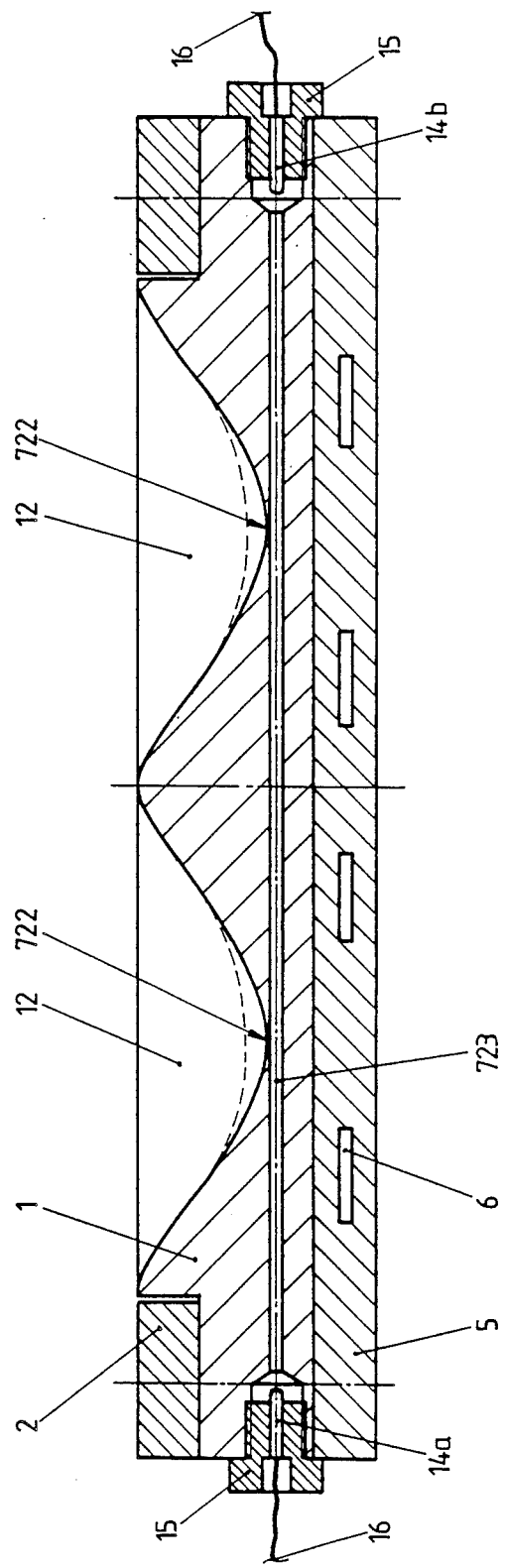
FIG. 12 is a cross section of another embodiment of a sputtering source with indirect cooling, where the two sensors are configured as a signal generator and signal receiver.

A version of this configuration of the invention is shown in FIG. 12. In this version, two laterally secured sensors 714a, 714b are provided, linked by a continuous bore 723. If a photometric quantity such as the density of illumination is used as the physical value monitored, this arrangement may be operated as a transmitter line in that one of the sensors is replaced by a signal emittor. When erosion 712 reaches one of the discontinuities or interfaces 722, the transmission line of bore 723 is disturbed. This version offers the advantage that the erosion 712 of the target 71 can be monitored over the entire extent of the target SIMULTANEOUSLY, and that the site of maximum erosion 712 need not be known.

Another sensing technique is to use a recess or a bore as a HF or microwave resonator driven in resonance by a microwave diode as by a Gun-diode, and to detect spoiling of the resonator cavity of such a bore when erosion penetrates to the interface surface 722.

While specific embodiments of the invention have been shown and described in detail to illustrate the application of the principles of the invention, it will be understood that the invention may be embodied otherwise without departing from such principles.

What is claimed is:

1. A method for detecting a predetermined depth of erosion within a target of a sputtering source for cathode sputtering process, comprising the steps of:
   monitoring a physical value, which physical value is steadily changing as a function of depth or erosion within said target using a sensor outputting a signal representing the physical value monitored;
   providing at least one material discontinuity at a predetermined depth along the path of erosion through the target, such that said physical value significantly changes when the erosion reaches said discontinuity resulting in a discontinuity of said signal; and,
   detecting the occurrence of a discontinuity of the rate of change of said signal with respect to time, as an indication that erosion has reached said material discontinuity, said indication being substantially independent from steady dependency of said changing physical value with respect to erosion depth to said material discontinuity.

2. The method according to claim 1, further providing said material discontinuity by a material interface of target material and a material which is compatible with the sputtering process, not to contaminate said sputtering process as erosion reaches said compatible material.

3. The method according to claim 1, whereby said material discontinuity is provided by material interface between target material and gas.

4. The method according to claim 1, wherein heat development is monitored as said physical value and a predetermined change of said developed heat is detected as said discontinuity of said steadily changing physical value.

5. The method according to claim 1, further providing said material discontinuity by a material interface of target material and a gas within a compartment and placing said sensor for monitoring within said compartment.

6. The method according to claim 5, further placing said sensor within said compartment remote from an area of said compartment where said erosion first penetrates said material discontinuity formed by target material bordering said compartment and material within said compartment.

7. The method according to claim 1, further comprising the steps of forming said signal substantially according to time derivation of said physical value and detecting said discontinuity of said steadily changing physical value by comprising said time derivation with a predetermined reference value.

8. The method according to claim 1, wherein said physical value is selected to be one of heat, pressure, light and the occurrence of charged particles.

9. A target arrangement for detecting a predetermined depth of erosion within a target of a sputtering source for cathode sputtering process, comprising:

sensor means for monitoring a physical value, said physical value steadily changing as a function of depth or erosion of said target, said sensor means outputting a signal corresponding to said physical value monitored;

a material interface providing a discontinuity of material, said discontinuity of material generating a discontinuity in said steadily changing physical value upon said erosion reaching said material discontinuity; and detection means connected to an output of said sensor means for detecting a discontinuity of the rate of change said output signal with respect to time corresponding to said discontinuity of said physical value upon said erosion reaching said material discontinuity, the occurrence of said discontinuity of said physical value being substantially independent from the steady change of said physical value as said erosion approaches said material interface.

10. The arrangement according to claim 9, wherein said discontinuity of material is formed with material compatible with the sputtering process.

11. The arrangement according to claim 9, wherein said interface is formed by a target material and gas.

12. The arrangement according to claim 9, wherein said sensor means is at least one of a heat sensor, a pressure sensor, an optical sensor, an electric charge sensor, a particle sensor.

13. The arrangement according to claim 9, wherein said sensor means includes a measuring surface made of target material.

14. The arrangement according to claim 9, wherein said interface is formed by a target material and gas, said gas being provided within at least one compartment or recess within said target material.

15. The arrangement according to claim 14, further comprising at least two compartments, arranged in at least one of staggered in depth beyond a virgin surface of a target and of disposed along and beyond said surface.

16. The arrangement according to claim 9, wherein said sensor means generates an output signal proportional to time derivation of said physical value.

17. The arrangement according to claim 16, wherein said output signal is led to comparator means, said comparator means being connected to a reference signal source.

* * * * *